Dec. 29, 1964 I. M. ROSS 3,163,562
SEMICONDUCTOR DEVICE INCLUDING DIFFERING
ENERGY BAND GAP MATERIALS
Filed Aug. 10, 1961

INVENTOR
I. M. ROSS
BY H. W. Lockhart
ATTORNEY

United States Patent Office 3,163,562
Patented Dec. 29, 1964

3,163,562

SEMICONDUCTOR DEVICE INCLUDING DIFFERING ENERGY BAND GAP MATERIALS

Ian M. Ross, Summit, N.J., assignor to Bell Telephone Laboratories, Incorporated, New York, N.Y., a corporation of New York Filed Aug. 10, 1961, Ser. No. 130,511
2 Claims. (Cl. 148—33.4)

Figure 1:
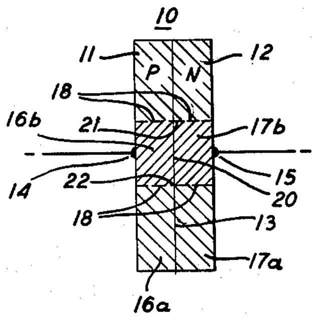

This invention relates to semiconductor devices. More particularly, this invention relates to semiconductor devices exhibiting electrical characteristics particularly enhanced by virtue of the inclusion therein of a multiplicity of semiconductor materials.

Semiconductor materials conveniently are referred to herein in terms of the forbidden energy gap lying between the top of the valence band and the bottom of the conduction band which appears in its corresponding energy diagram. Accordingly, silicon, aluminum antimonide and gallium phosphide which have forbidden energy gaps of 1.1, 1.5 and 2.2 electron volts respectively typically are referred to as wide gap materials and germanium, indium antimonide and gallium antimonide with forbidden gaps of .72, .18 and .68 electron volt respectively are referred to as narrow gap materials. Alloys, such as germanium-silicon alloys, can be prepared with energy gaps of intermediate values. It is in accordance with the invention to utilize as the semiconductive element a wafer, typically monocrystalline, including at least two different semiconductor materials one of which has an energy gap relatively wide with respect to the other. In this connection the difference between the energy gaps is, advantageously, at least .2 electron volt. However, a smaller difference would still be useful. Accordingly, while the various semiconductor materials are referred to as wide or narrow gap materials, it is to be understood that the relative scale is important rather than the absolute values.

Semiconductor devices which exhibit electrical characteristics determined by a PN junction included therein are termed PN junction devices and, more sepcifically, junction diodes, triodes or transistors and tetrodes, depending on the number of electrical contacts attached thereto.

An object of this invention is an improved PN junction device including a combination of zones of different energy gap semiconductor materials, advantageously in a single crystal.

As used herein, the boundary defined by the interface between materials of different energy gaps is designated a heterojunction. By way of contrast, the boundary between two regions of opposite conductivity type shall be described as a PN junction. A heterojunction can be coincident, noncoincident or partially coincident with respect to a PN junction. In this connection, the term "coincident" indicates coincidence along its entire area; "partially coincident" indicates coincidence along only a portion of its area; the term "noncoincident" indicates spatial separation.

The invention is based on the recognition that certain advantages accrue to a PN junction device which includes either a partially coincident or a noncoincident heterojunction. More specifically, and as described in more detail hereinafter, in accordance with this invention, the effective area of a PN junction is controlled in size by the use of an appropriate heterojunction; that is, the PN junction divides distinct portions of wide gap and narrow gap materials. For example, by the use of a heterojunction the emission of charge carriers from the emitter zone of a transistor can be concentrated with an attending reduction in emitter capacitance as compared to corresponding devices of the prior art. Moreover, the use of heterojunctions facilitates the fabrication of compound logic elements as is described in detail below.

In one specific embodiment in accordance with this invention the characteristics of a semiconductor diode whose bulk portion is of silicon are modified advantageously by including a zone of germanium so as to form a partially coincident heterojunction. In this connection a "zone" is a volume of semiconductor material distinct from a conductivity type region.

The invention and its objects and features will be understood more completely from the detailed description rendered in conjunction with the following drawing, wherein:

FIGS. 1 to 5 are schematic cross sections of semiconductor devices in accordance with this invention.

It is to be understood that the figures are not necessarily to scale, certain dimensions having been exaggerated for illustrative purposes.

With particular reference to FIG. 1, the semiconductor device 10 comprises a single crystal including a P-type conductivity region 11 and an N-type conductivity region 12 defining a planar PN junction 13 therebetween and low resistance contacts 14 and 15 respectively to such regions. The region 11 is made up of a bulk zone 16A of a wide gap material, such as silicon, and a central zone 16B of a narrower gap material, such as a germanium-silicon alloy. Similarly, the region 12 includes a bulk zone 17A of silicon and a central zone 17B of a germanium-silicon alloy, so disposed as to form a cylindrical heterojunction 18. The interface 20 between the zones 16B and 17B is coincident with a central portion of the PN junction 13. However, the heterojunction 18 formed between the two different semiconductor materials is coincident with the PN junction only in the very limited region where the two intersect. Therefore, this device is essentially of the noncoincident type. It can be seen from the figure that PN junction 13 separates portions of like material.

As is known, the value of forward bias needed for injection across a PN junction is related to the width of the energy gap, the wider the gap the larger the bias needed to overcome the potential hill. Accordingly, in response to appropriate voltages, that is, values enough to cause injection across portion 20 of the junction but too low for injection across the rest of the junction, injection of holes and electrons across the PN junction will take place essentially only along the restricted portion 20 of the PN junction 13, so that only such portion of the junction is really active and fixes the electrical characteristics of the device.

Figure 2:
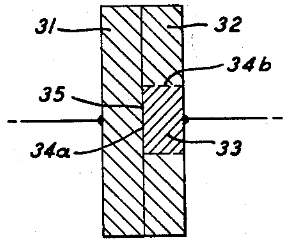

A modification of the device of FIG. 1 is shown in FIG. 2. The device is similar except that only the N-type conductivity region 32 includes a zone 33 of narrow gap material, the P-type region 31 being entirely of wide gap material. However, here the heterojunction has a portion 34A which is coincident with a central portion of the PN junction 35 and portion 34B not so coincident. Accordingly, the device is of the partially coincident type. Here the PN junction separates both portions of like and unlike materials. In this device, in response to a forward bias of appropriate value applied between contacts to each side of the PN junction, the forward current produced thereby is limited to the injection of holes across junction 34A from region 31 into portion 33. A PN junction characteristic of this kind is potentially useful for providing an emitter of high gamma.

Figure 3:
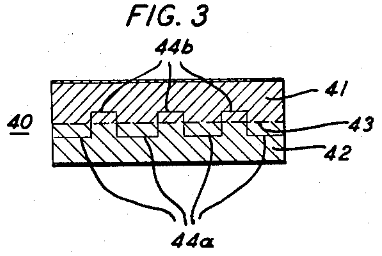
Figure 4:
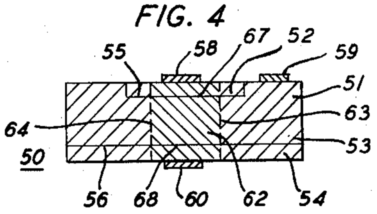
Figure 5:
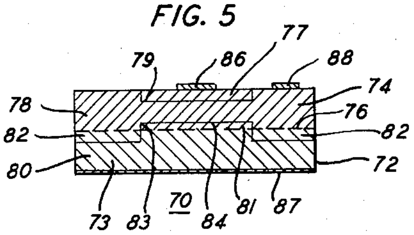

The properties of the noncoincident and partially coincident heterojunction device, as exemplified by FIGS. 1 and 2, are equally in evidence in the more complicated devices of FIGS. 3 through 5.

In the crystal 40 of FIG. 3, the zone 41 comprises narrow gap material, while the zone 42 comprises wide gap material. Between them is formed the planar heterojunction 43 shown by the broken line. The distribution of impurities in the device is such as to result in a PN junction shaped in cross section like an embattlement which crosses and recrosses the heterojunction 43 to form portions 44A and 44B alternately on opposite sides of heterojunction 43. When such a device is forward biased an appropriate amount, emission occurs only across the portions 44B of the PN junction lying within the narrow gap material. Accordingly, emission is concentrated without incurring IR drops in any of the conductivity type regions as is otherwise necessary.

FIG. 4 illustrates a junction transistor 50 including a crystal whose bulk portion 51 is of wide gap material, typically silicon. The crystal comprises three distinct conductivity type regions 52, 53 and 54, typically of P, N, and P-type conductivity, respectively, and defining therebetween PN junctions 55 and 56. The three conductivity type regions correspond to the emitter, base and collector regions of the transistor and these are provided with low resistance contacts 58, 59 and 60, respectively. Central zone 62, comprising narrow gap material such as germanium, extends from the emitter region through the base region into the collector region traversing the entire distance between contacts 58 and 60, crossing both PN junctions 55 and 56 and defining heterojunctions 63 and 64. The device, accordingly, is of the noncoincident type.

In operation with appropriate biases, emission of charge carriers from either PN junction 55 or 56 is constrained to the portions 67 and 68 of the PN junctions between the heterojunctions. This device exhibits a relatively high forward and reverse $\alpha$ manifesting itself advantageously as a low "turn on" voltage. In this connection $\alpha$ is the current gain of the transistor in the common-base circuit arrangement. Moreover, even when the device is biased into the saturation condition, emission is still confined to the limited portion of the junctions resulting in the rapid removal of stored charge carriers prior to switching off. A further advantage of this device is that emission does not occur adjacent to any surface. Accordingly, the excess minority carrier density adjacent to any surface effectively is zero and the $\alpha$ of such a device is relatively insensitive to changes in surface recombination velocity.

Similar advantages are exhibited by a device quite similar to that of FIG. 4 but including a narrow gap material only in the base region of the transistor 50. The heterojunction in this instance is of the partially coincident type.

The transistor 70 of FIG. 5 comprises a single crystal semiconductor wafer 72 including a zone 73 of silicon and a zone 74 of germanium forming heterojunction 76 therebetween. The zone 74 of germanium includes a surface region 77 of one conductivity type and a zone 78 of the opposite conductivity type defining PN junction 79 therebetween. The region 73 of silicon includes a bulk zone 80 of the same conductivity type as the surface region 77 and two smaller high resistivity zones 82 of the opposite conductivity for forming a mesa-shaped PN junction 83. The plateau 84 of PN junction 83 protrudes through the heterojunction 76 into the zone 74 of germanium forming the active portion of the PN junction in registry with and having an area equal to PN junction 79. A low resistance aluminum contact 86 is connected to surface region 77 which forms the emitter region of the completed transistor. Similarly, low resistance gold-antimony contact 87 is connected to zone 80 which with the zone 81 of germanium forms the collector region. The remaining zones 78 of germanium and 82 of silicon are of the same conductivity type and collectively constitute the base region of the transistor. The base region is contacted conveniently by low resistance aluminum contact 88. The heterojunction is of the noncoincident type and the device is characterized by: (1) an emitter junction of limited area and corresponding minimized emitter capacitance, and (2)

a collector junction, the unused portion of which includes a high sensitivity area, and a corresponding low collector capacitance.

The active portion 84 of PN junction 83 and PN junction 79 are shown to be of equal area and in registry with one another; however, it may be desirable to make junction 79 of relatively greater area. For example, the active portion of junction 83 can be made smaller than junction 79 and the polarity of the applied biases reversed, thereby reversing the function of the collector region and the emitter region. In view of the fact that the common emitter mode of operation is the most frequently used mode of transistor operation and useful particularly in logic systems, this arrangement facilitates the fabrication of multiple transistors in one slice of semiconductor material (emitter side down) as a logic block which is bonded conveniently to the encapsulation by way of the back surface of the slice. Alternatively, the emitter and collector junctions can be of equal area as shown and the resulting device is a symmetrical transistor exhibiting the same collector efficiency when biased in either direction. A symmetrical transistor is particularly useful in chopper amplifiers.

Similar symmetrical electrical properties are exhibited by a device substantially the same as the device of FIG. 5 except that the mesa portion 89 of the collector junction 77 coincides with heterojunction 86.

Another variation of the structure of FIG. 5 includes a region of narrow gap material restricted to that portion of the base region lying between the emitter junction and the mesa portion of the collector junction. This device has the additional advantage, discussed above, that the emission of charge carriers does not occur adjacent to a surface of the device.

Referring in particular to FIG. 5, a transistor in accordance with this invention can be fabricated as follows: A slice of N-type conductivity silicon .310 x .310 x .010 inch having a resistivity of .01 ohm-centimeter is exposed to a vapor of silicon tetrachloride and hydrogen for one minute at 1270 degrees centigrade for depositing an epitaxial silicon film of .0001 inch thickness and of 30 ohm-centimeters resistivity. The film is then converted to P-type conductivity exhibiting a sheet resistivity of 50 ohms per square by well known boron diffusion techniques. The surface of the slice is exposed selectively by well known oxidation and photo-resist techniques to a vapor of phosphorus pentoxide for ninety minutes at 1050 degrees centigrade thereby diffusing phosphorus into the central portion of the slice to convert to to N-type conductivity down to the original N-type substrate. Next the slice is exposed to a vapor of silicon tetrachloride, germanium tetrachloride and hydrogen for eight minutes at 1250 degrees centigrade to deposit an epitaxial film of silicon-germanium alloy of P-type conductivity, of .0002 inch thickness and of 0.1 ohm-centimeter resistivity. During this step, at an elevated temperature, phosphorus from the diffused central portion of the substrate diffuses into the deposited film to produce the projecting portion of the PN junction boundary 84. The silicon-germanium alloy forms the narrow gap region and the silicon forms the wide gap region of the structure. The central portion of the deposited film surface of the slice then is exposed selectively by similar techniques to a vapor of phosphorus pentoxide for ten minutes at 1050 degrees centigrade for converting a portion of the surface to N-type conductivity, thus forming the emitter region 77 of the device. This region is .00004 inch thick and is situated concentrically with respect to the previous localized region of N-type conductivity which serves as the collector. Aluminum contacts are affixed to the base and emitter regions and a gold-antimony contact to the substrate by alloying techniques. Surplus semiconductor material is then removed by etching to limit the area of the collector-to-base junction.

The resulting device exhibits the following characteristics which compare favorably to those of a corresponding mesa transistor and are of particular advantage in switching applications:

| | | |
|---|---|---|
| Collector capacitance ($V_{CB}=0$) | μμf | 6 |
| Emitter capacitance ($V_{EB}=0$) | μμf | 1 |
| Current gain in grounded emitter connection ($I_C=10$ ma., $V_{CE}=1$ volt) | | 30 |
| Total minority carrier charge storage ($I_C=10$ ma., $I_B=1$ ma.) | coulombs | $5\times10^{-11}$ |
| Collector saturation voltage ($I_C=10$ ma., $I_B=1$ ma.) | volt | .03 |

Although specific embodiments have been shown and described, it is to be understood that they are merely illustrative of the invention which is susceptible of numerous and varied modifications, all clearly within the scope of the present invention, as will at once be apparent to those skilled in the art. No attempt has been made to exhaustively illustrate all such possibilities.

What is claimed is:

1. A semiconductor device comprising a substantially monocrystalline semiconductor wafer, said wafer including therein a first PN junction defined by the boundary between a first region of N-type conductivity material and a region of boron-doped P-type conductivity material, said PN junction having a substantially planar configuration except for a portion thereof of phosphorus diffused N-type conductivity material which projects into said region of P-type conductivity material, said projecting portion having a planar boundary substantially parallel to the rest of said first PN junction, a second PN junction defined by the boundary of said P-type conductivity region and a second N-type conductivity region, said second PN junction having a major planar surface substantially parallel to said first PN junction, a heterojunction defined by the boundary between two different semiconductor materials having differing energy gap, said heterojunction having a substantially planar configuration parallel to said PN junctions and intersecting and passing through said projecting portion of said first PN junction so that parts of said projecting portion are on both sides of said heterojunction.

2. A semiconductor device in accordance with claim 1 in which said second PN junction is disposed directly opposite the projecting portion of said first PN junction and of substantially identical lateral extent.

References Cited in the file of this patent

UNITED STATES PATENTS

| | | |
|---|---|---|
| 2,855,334 | Lehovec | Oct. 7, 1958 |
| 2,911,539 | Tanenbaum | Nov. 3, 1959 |
| 2,929,859 | Loferski | Mar. 22, 1960 |
| 3,089,794 | Marinace | May 14, 1963 |

FOREIGN PATENTS

| | | |
|---|---|---|
| 1,029,942 | Germany | May 14, 1958 |
| 1,090,326 | Germany | Oct. 6, 1960 |
| 1,184,921 | France | Feb. 9, 1959 |
| 1,193,194 | France | Apr. 27, 1959 |
| 742,237 | Great Britain | Dec. 21, 1955 |
| 843,407 | Great Britain | Aug. 4, 1960 |